United States Patent
English

(10) Patent No.: US 7,501,587 B2
(45) Date of Patent: Mar. 10, 2009

(54) MOUNTING CLIPS FOR USE WITH ELECTROMAGNETIC INTERFERENCE SHIELDING AND METHODS OF USING THE SAME

(75) Inventor: Gerald R. English, Glen Ellyn, IL (US)

(73) Assignee: Laird Technologies, Inc., Chesterfield, MO (US)

( * ) Notice: Subject to any disclaimer, the term of this patent is extended or adjusted under 35 U.S.C. 154(b) by 126 days.

(21) Appl. No.: 11/735,827

(22) Filed: Apr. 16, 2007

(65) Prior Publication Data

US 2008/0251893 A1 Oct. 16, 2008

(51) Int. Cl.
*H05K 9/00* (2006.01)

(52) U.S. Cl. .................. 174/354; 174/371; 174/372; 174/382; 361/818

(58) Field of Classification Search .............. 174/350, 174/377, 354, 355, 369, 371, 372, 382; 361/816, 361/818, 800
See application file for complete search history.

(56) References Cited

U.S. PATENT DOCUMENTS

| | | | |
|---|---|---|---|
| 5,015,802 A | | 5/1991 | Chi |
| 5,354,951 A | | 10/1994 | Lange, Sr. et al. |
| 5,920,984 A | * | 7/1999 | Persson et al. ................ 29/836 |
| 6,051,781 A | | 4/2000 | Bianca et al. |
| 6,053,771 A | * | 4/2000 | Hood et al. .................. 439/607 |
| 6,122,167 A | * | 9/2000 | Smith et al. .................. 361/687 |
| 6,144,557 A | * | 11/2000 | Chen et al. ................... 361/704 |
| 6,166,918 A | * | 12/2000 | Olofsson et al. ............. 361/800 |
| 6,267,629 B1 | | 7/2001 | Nguyen et al. |
| 7,285,732 B2 | * | 10/2007 | Vinokor et al. .............. 174/382 |

FOREIGN PATENT DOCUMENTS

| | | |
|---|---|---|
| DE | 10103619 | 8/2001 |
| EP | 0222656 | 6/1987 |
| GB | 2257839 | 1/1993 |
| WO | WO03/030609 | 4/2003 |

OTHER PUBLICATIONS 6 pages printed Apr. 16, 2007 from www.harwin.com website relating to Surface Mount RFI Clips.

* cited by examiner

*Primary Examiner*—Hung V Ngo
(74) *Attorney, Agent, or Firm*—Harness, Dickey & Pierce, P.L.C.

(57) ABSTRACT

According to various aspects, exemplary embodiments are provided of clips that may be compatible with surface mount technology. The clips may be surface mountable to a substrate for allowing repeated releasable attachment and detachment of a shielding structure thereto. In one exemplary embodiment, a clip generally includes a base member having generally opposed first and second side edge portions. Two or more arms extend generally upwardly in a first direction from the base member. The clip also includes a generally flat pick-up surface configured to enable the clip to be picked up by a head associated with pick-and-place equipment.

23 Claims, 16 Drawing Sheets

MOUNTING CLIPS FOR USE WITH ELECTROMAGNETIC INTERFERENCE SHIELDING AND METHODS OF USING THE SAME

FIELD

The present disclosure relates generally to shielding structures for electronic systems and devices, and more particularly to mounting clips for use in releasably securing shielding structures to substrates containing electronic systems and devices.

BACKGROUND

The statements in this section merely provide background information related to the present disclosure and may not constitute prior art.

Electronic equipment often generates electromagnetic signals in one portion of the electronic equipment which may radiate to and interfere with another portion of the electronic equipment. This electromagnetic interference (EMI) may cause degradation or complete loss of important signals, thereby rendering the electronic equipment inefficient or inoperable. To reduce the adverse effects of EMI, electrically conducting (and sometimes magnetically conducting) material may be interposed between portions of the electronic circuitry for absorbing and/or reflecting EMI energy. This shielding may take the form of a wall or a complete enclosure placed around the portion of the electronic circuit generating the electromagnetic signal, and/or the shielding may be placed around the portion of the electronic circuit which is susceptible to the electromagnetic signal. By way of example, electronic circuits of a printed circuit board (PCB) are often enclosed by shields permanently attached to the PCB to localize the EMI within its source and/or insulate other circuits proximal to the EMI source.

As used herein, the terms electromagnetic interference (EMI) should be considered to generally include and refer to both EMI and radio frequency interference (RFI) emissions. The term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

SUMMARY

According to various aspects, exemplary embodiments are provided of clips that may be compatible with surface mount technology. The clips may be surface mountable to a substrate for allowing repeated releasable attachment and detachment of a shielding structure thereto. In one exemplary embodiment, a clip generally includes a base member having generally opposed first and second side edge portions. Two or more arms extend generally upwardly in a first direction from the base member. The two or more arms may include first and second arms extending generally upwardly from the respective first and second side edge portions of the base member such that the first and second arms are offset in an alternating arrangement along a length of the base member. The first and second arms may have overlapping contact apexes for squeezing opposite surfaces of a wall portion of the shielding structure when the shielding structure's wall portion is positioned therebetween. The clip may further include a generally flat pick-up surface extending generally horizontally from the base member in a second direction substantially orthogonal to the first direction. The pick-up surface may be configured to enable the clip to be picked up by a head associated with pick-and-place equipment.

In some embodiments, locking structure may be provided on at least one of the two or more arms. The locking structure may be configured to engage the shielding structure for helping releasably secure the shielding structure to the clip when the shielding structure's wall portion is positioned between the contact apexes of the first and second arms.

In some embodiments, a clip may include at least one stabilizer extending generally horizontally from the base member in the second direction at a location generally opposing at least one of the arms, the at least one stabilizer configured to help stabilize the clip's positioning on the substrate during installation.

In some embodiments, a clip may include a substantially flat pick-up surface configured to enable the clip to be picked up by a head associated with pick-and-place equipment. The pick-up surface may extend generally horizontally from the base member in a second direction substantially orthogonal to the first direction. The pick-up surface may be a location substantially aligned with at least one of the arms.

Other aspects of the present disclosure relate to methods of attaching shielding structures to printed circuit boards or other substrates, One exemplary embodiment provides a method of attaching a wall portion of a shielding structure to a printed circuit board (PCB) using a clip that allows repeated releasable attachment and detachment of the shielding structure's wall portion thereto. In this particular embodiment, the clip includes a base member, first and second arms having overlapping contact apexes, and a pick-up surface. The method generally includes removing the clip from a pocket of a carrier tape by using a head associated with pick-and-place equipment that engages the pick-up surface of the clip; surface mounting the clip to the PCB; relatively moving at least one of the first and second arms to thereby move apart the overlapping contact apexes and receiving the shielding structure's wall portion therebetween; and releasably locking the shielding structure's wall portion to at least one arm of the clip.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

Figure 6:
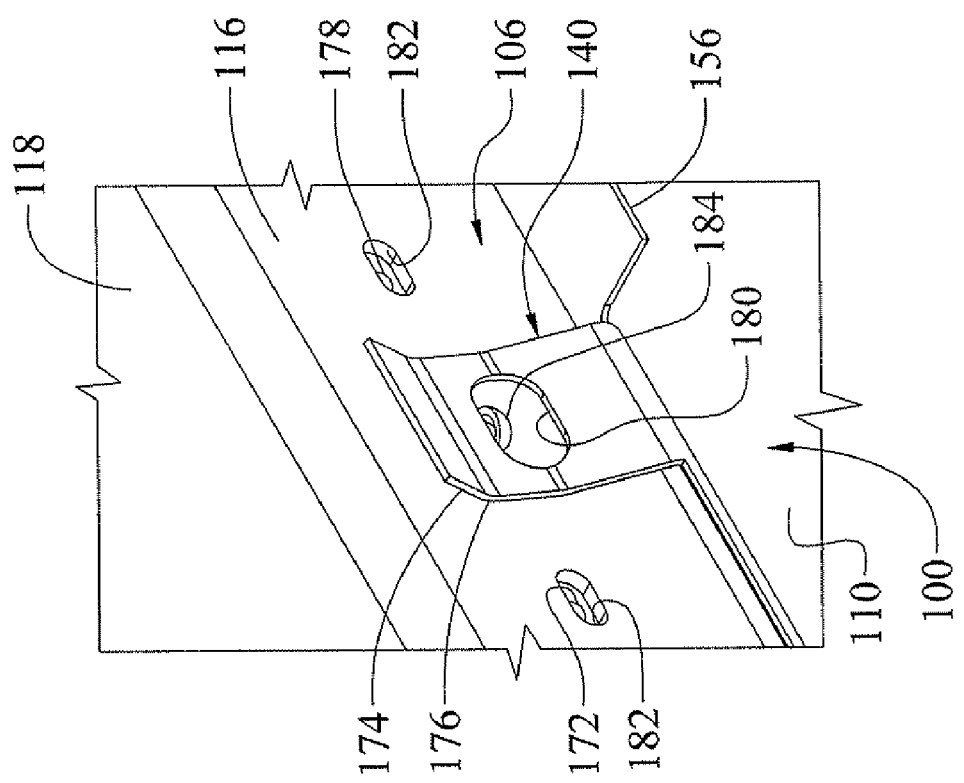
Figure 7:
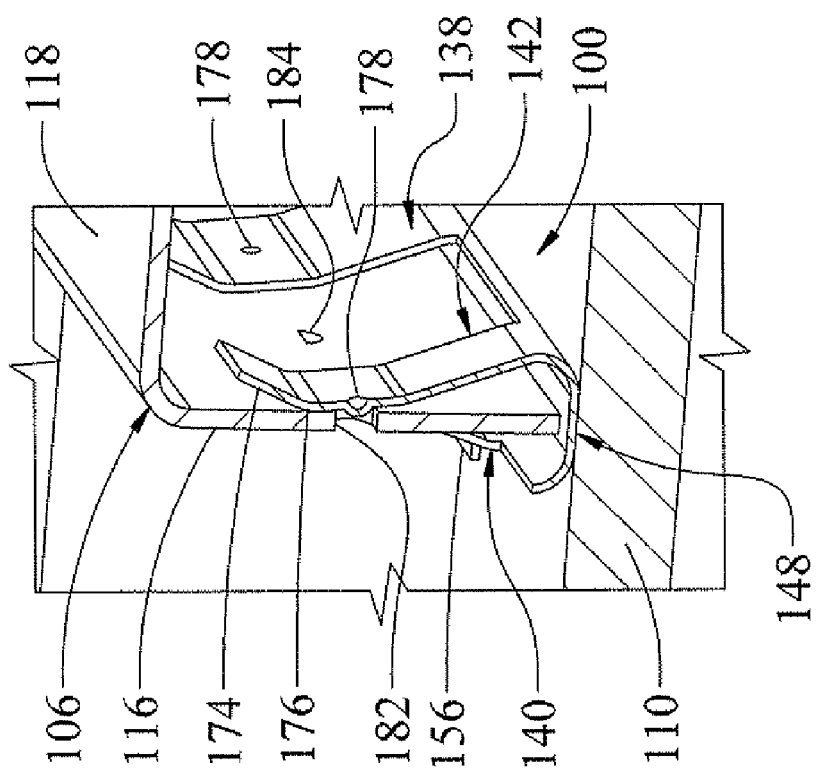
Figure 8:
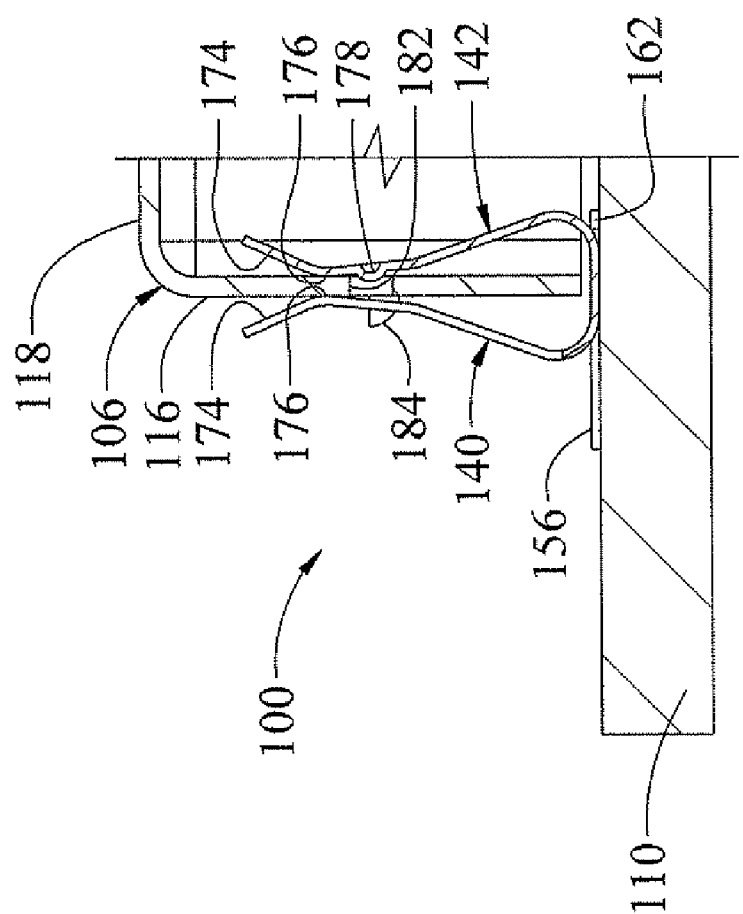
Figure 9:
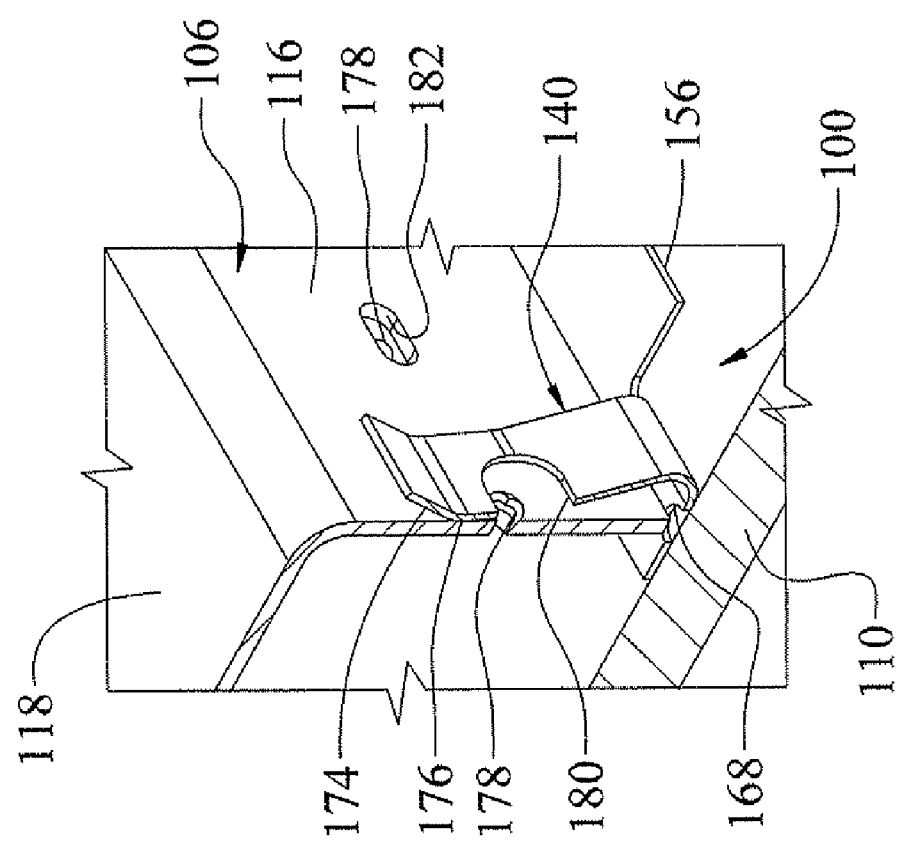
Figure 10:
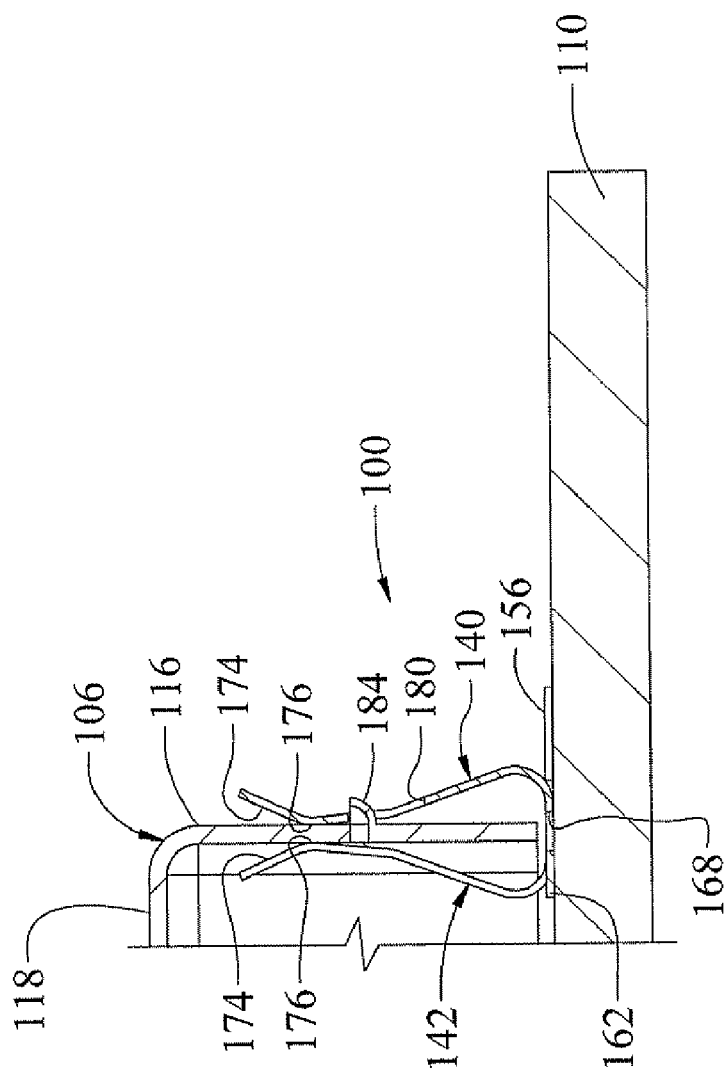
Figure 11:
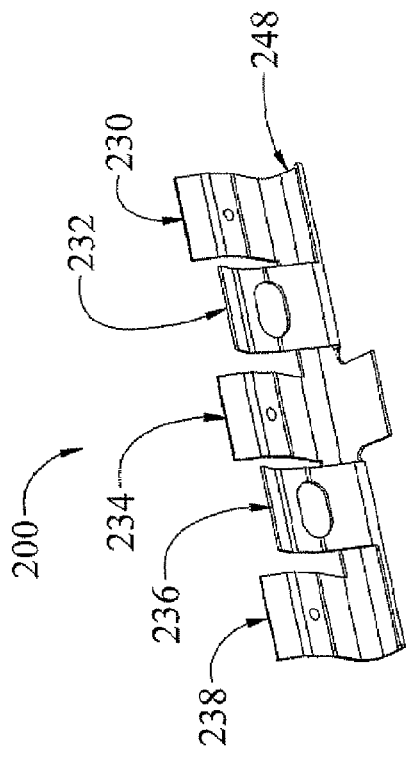
Figure 13:
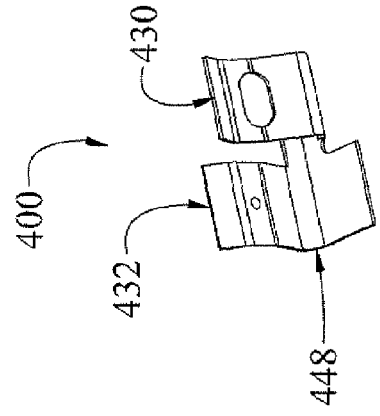
Figure 12:
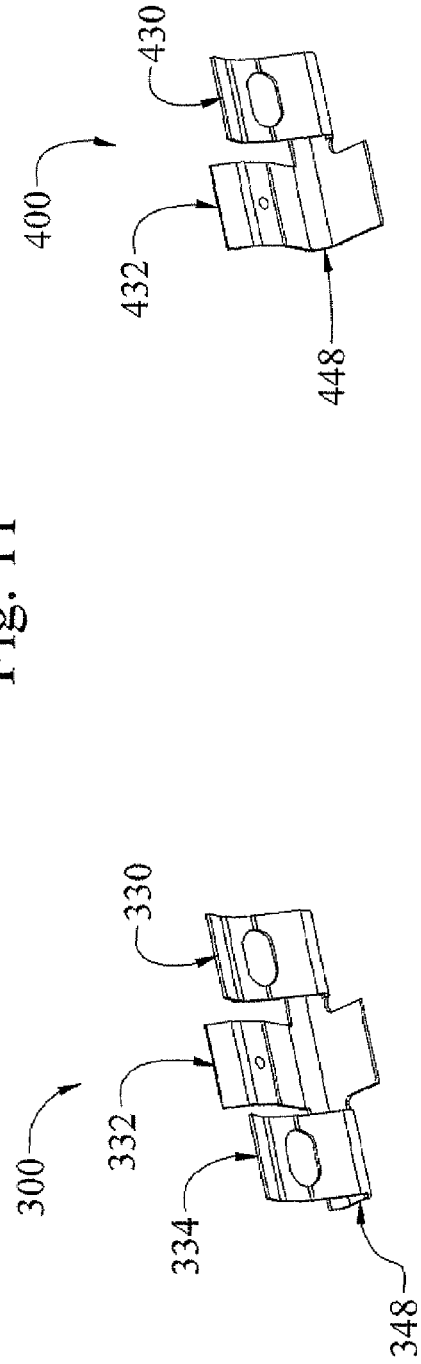
Figure 14:
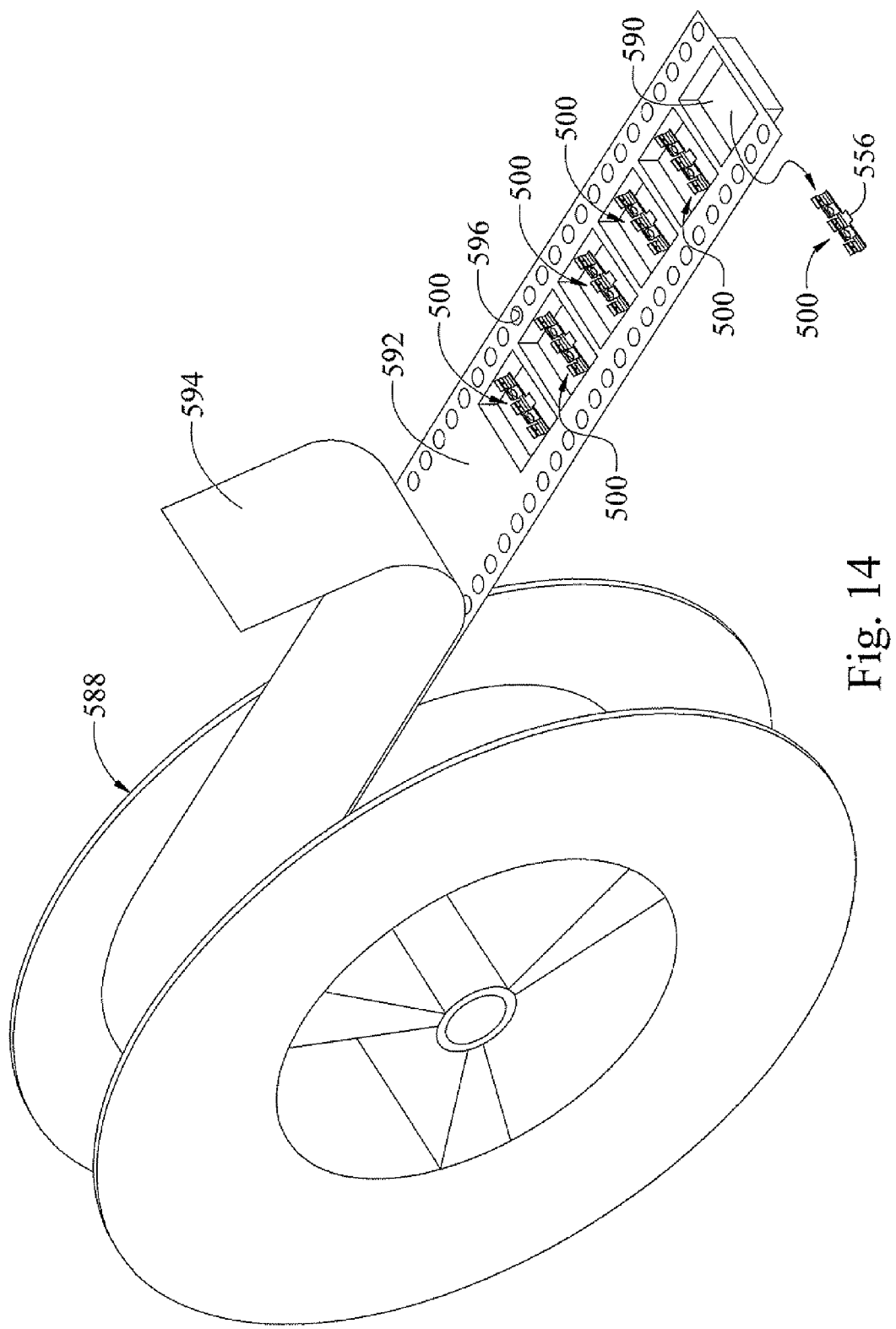
Figure 15:
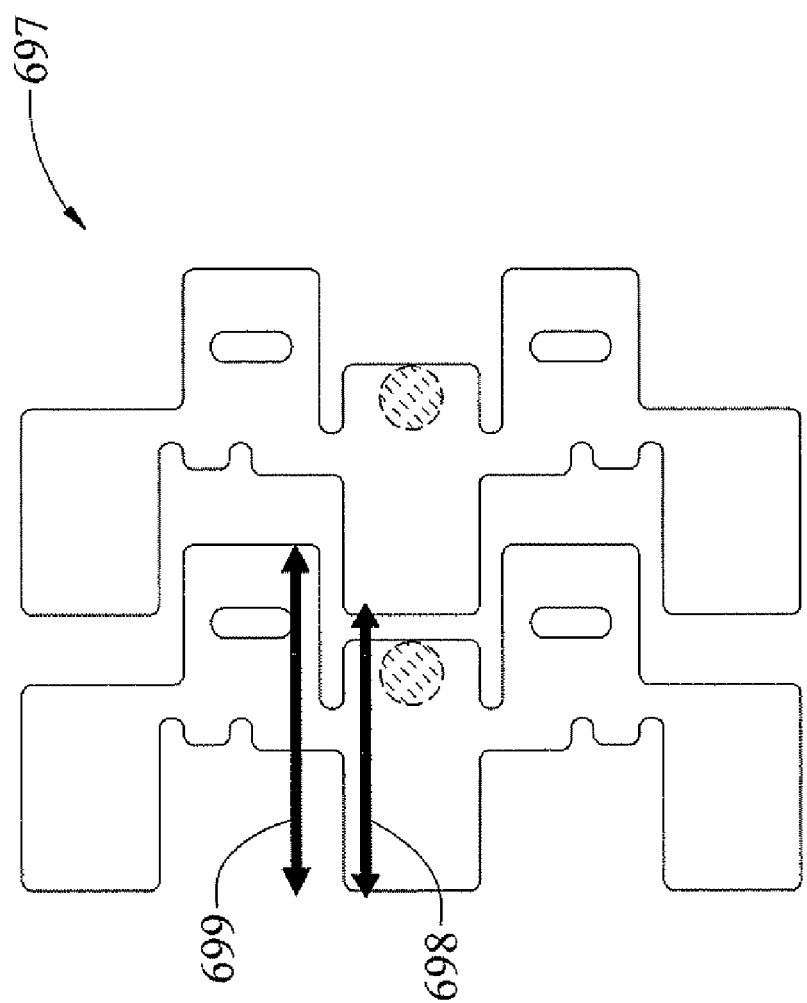
Figure 16:
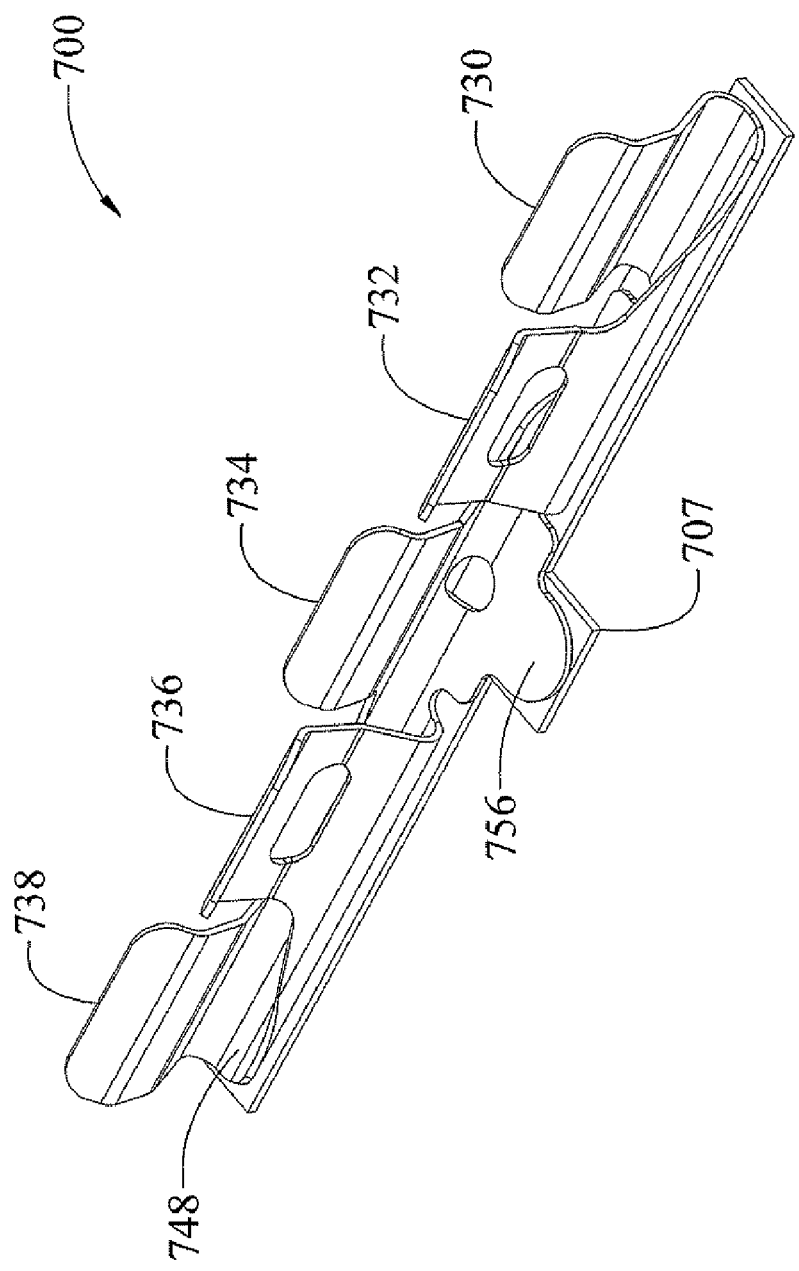
Figure 18:
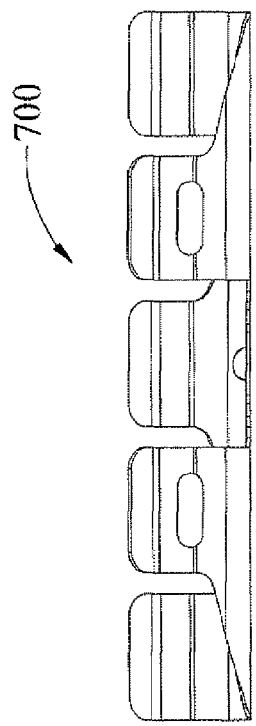
Figure 19:
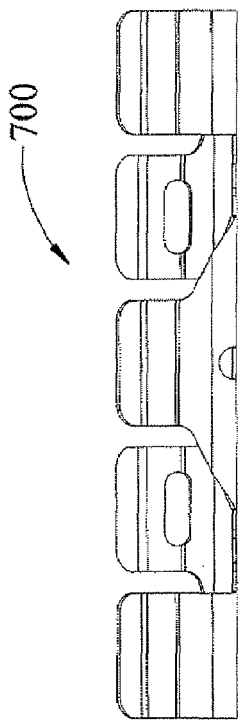
Figure 20:
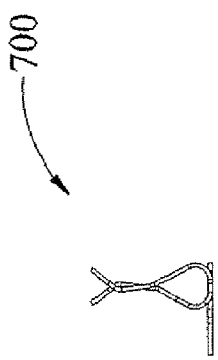
Figure 17:
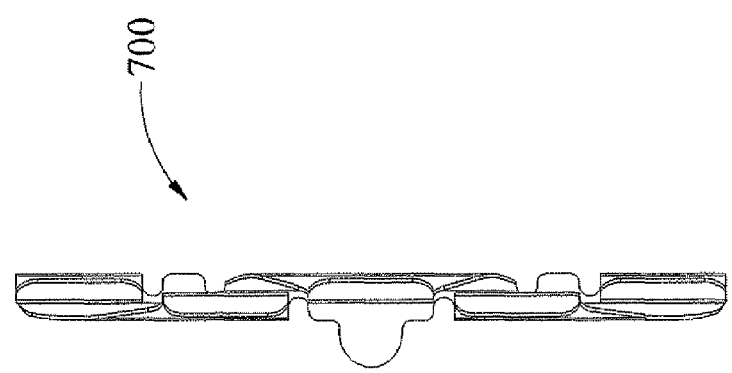
Figure 22:
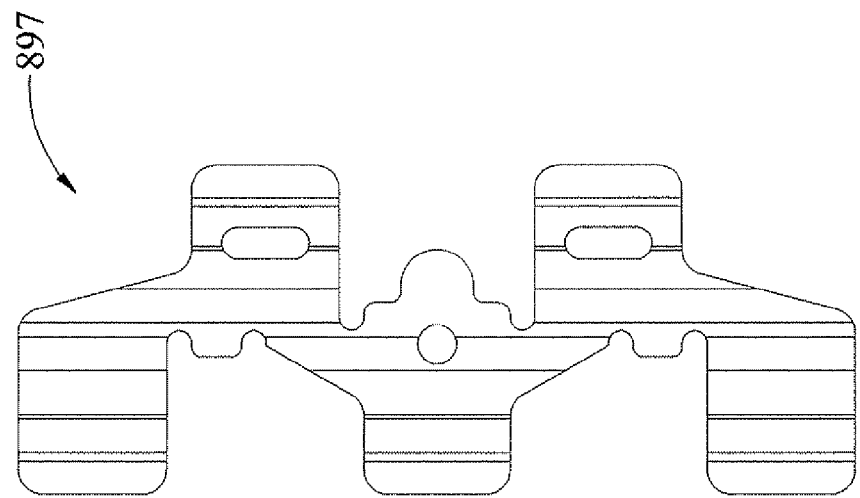
Figure 21:
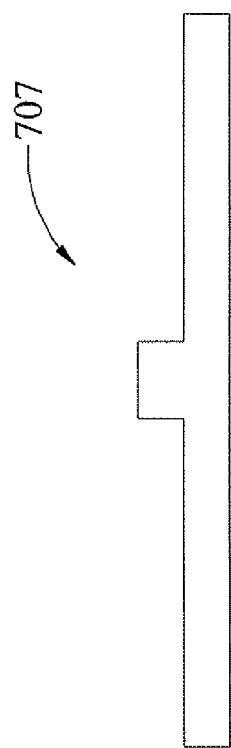

FIG. 6 is a partial perspective view illustrating the shielding structure's side wall portion inserted into and engaged with the mounting clip, and further illustrating the engagement of protrusions of one of the mounting clip's arm with a corresponding opening within the shielding structure's side wall portion and the engagement of a protrusion of the shielding structure's side wall portion within a corresponding opening of another one of the mounting clip's arm;

FIG. 7 is a perspective view similar to what is shown in FIG. 6 but with the shielding structure's side wall portion and mounting clip illustrated from an opposite side and with parts of the shielding structure's side wall portion and the mounting clip broken away to illustrate the engagement of the mounting clip protrusion within the corresponding opening of shielding structure's side wall portion;

FIG. 8 is an end elevation view of what is shown in FIG. 7;

FIG. 9 is a perspective view similar to what is shown in FIG. 6 with parts of the shielding structure's side wall portion and the mounting clip broken away to illustrate the protrusion of the shielding structure's side wall portion engagingly received within the opening of the mounting clip's arm;

FIG. 10 is an end elevation view of what is shown in FIG. 9;

FIG. 11 is a perspective view of another exemplary embodiment of a mounting clip having five arms;

FIG. 12 is a perspective view of still another exemplary embodiment of a mounting clip having three arms;

FIG. 13 is a perspective view of yet another exemplary embodiment of a mounting clip having two arms;

FIG. 14 is a perspective view illustrating an exemplary manner in which exemplary mounting clips may be stored in pockets of a continuous tape reel for retrieval by a head (not illustrated) of a pick-and-place machine;

FIG. 15 is a plan view of a blank prior to forming the blank into a mounting clip according to exemplary embodiments;

FIG. 16 is a perspective view of a mounting clip and a solder pad layout according to another exemplary embodiment;

FIG. 17 is a top view of the mounting clip shown in FIG. 16;

FIG. 18 is a front elevation view of the mounting clip shown in FIG. 16;

FIG. 19 is a back elevation view of the mounting clip shown in FIG. 16;

FIG. 20 is an end view of the mounting clip shown in FIG. 16;

FIG. 21 is a top plan view of an exemplary solder pad layout that may be used when soldering the mounting clip shown in FIGS. 16 through 20 to a printed circuit board according to exemplary embodiments;

FIG. 22 is a plan view of a blank prior to forming the blank into a mounting clip of FIGS. 16 through 19 according to exemplary embodiments.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
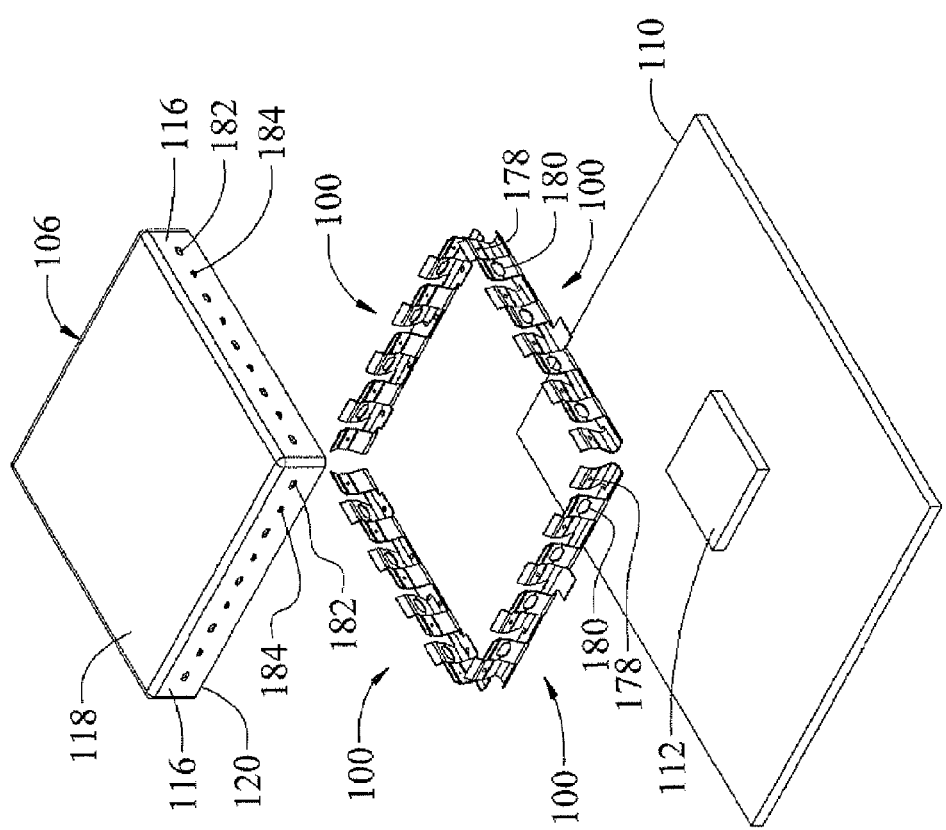
FIG. 1 is an exploded perspective view of four mounting clips according to an exemplary embodiment illustrated together with a shielding structure and a PCB to which the shielding structure may be attached by the mounting clips.

With reference now to the drawings, and particularly to FIG. 1, an exemplary embodiment is shown of a mounting clip 100 compatible with surface mount technology for attaching a shielding structure 106 to a printed circuit board 110 (a PCB, and more broadly, a substrate). FIG. 1 illustrates four exemplary mounting clips 100 together with the shielding structure 106 and the PCB 110. The exemplary mounting clips 100 are configured for surface mounting to the PCB 110, and for removably attaching the shielding structure 106 to the PCB 110.

The mounting clips 100 may be surface mounted to the PCB 110 generally along a perimeter of an area to be shielded (e.g., along a perimeter about one or more electrical components 112, etc.). The clips 100 allow for repeated releasable attachment, detachment, and reattachment of at least part of the shielding structure 106 to the PCB 110 for selectively shielding or accessing (e.g., servicing, repairing, replacing, etc.) the one or more electrical components 112 on the PCB. In the illustrated embodiment, each mounting clip 100 is substantially identical. But other exemplary embodiments may include one or more mounting clips that differ from one or more of the other mounting clips used to attach a shielding structure to a PCB. For example, two or more of the various exemplary embodiments of mounting clips disclosed herein may be used together to attach shielding structures to PCBs. In still other exemplary embodiments, more or less than four mounting clips may be used to attach shielding structures to PCBs depending, for example, on the relative sizing of the shielding structure to the mounting clips. By way of example, other embodiments may attach a shielding structure to a PCB using only a single mounting clip, six mounting clips, nine mounting clips, etc.

As shown in FIG. 1, the shielding structure 106 is a one-piece, generally square structure having four side wall portions 116 (only two of which are visible in FIG. 1) and a cover portion 118. A bottom portion 120 of the shielding structure 106 is open for positioning the shielding structure 106 generally over the one or more electrical components 112 on the PCB 110. When the shielding structure 106 is attached to the PCB 110, the side wall portions 116 and cover portion 118 are configured to generally surround the one or more electrical components 112. The shielding structure 106 preferably provides electromagnetic interference (EMI) shielding to the one or more electrical components 112 within the enclosed area cooperatively defined by the attached shielding structure 106 and PCB 110.

In other exemplary embodiments, shielding structures may be other than square in shape, including, for example, circular, triangular, rectangular, hexagonal, etc. In still other exemplary embodiments, shielding structures may comprise multi-component structures including, for example, frames (or fences) and lids (or covers) attached or attachable to the frames. In one embodiment, a frame may be generally square in shape and may include four side wall portions, an open bottom, and an open top. A lid may be configured (e.g., sized, shaped, etc.) to be attached to the frame to generally cover the frame's open top. In such examples, the lid may be secured to the frame by engagement of protruberances/openings, mechanical fasteners and/or connectors, releasable connectors, solder, adhesive, etc.

A wide range of materials may be used for the shielding structure 106. By way of example only, the shielding structure 106 may be formed from cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, suitable electrically-conductive and/or magnetic materials, etc. The materials provided herein are for purposes of illustration only, as the shielding structure 106 may be configured from different materials depending, for example, on the particular application, such as the particular electrical component(s) to be shielded, EMI shielding and heat dissipation needs, and other factors.

Figure 2:
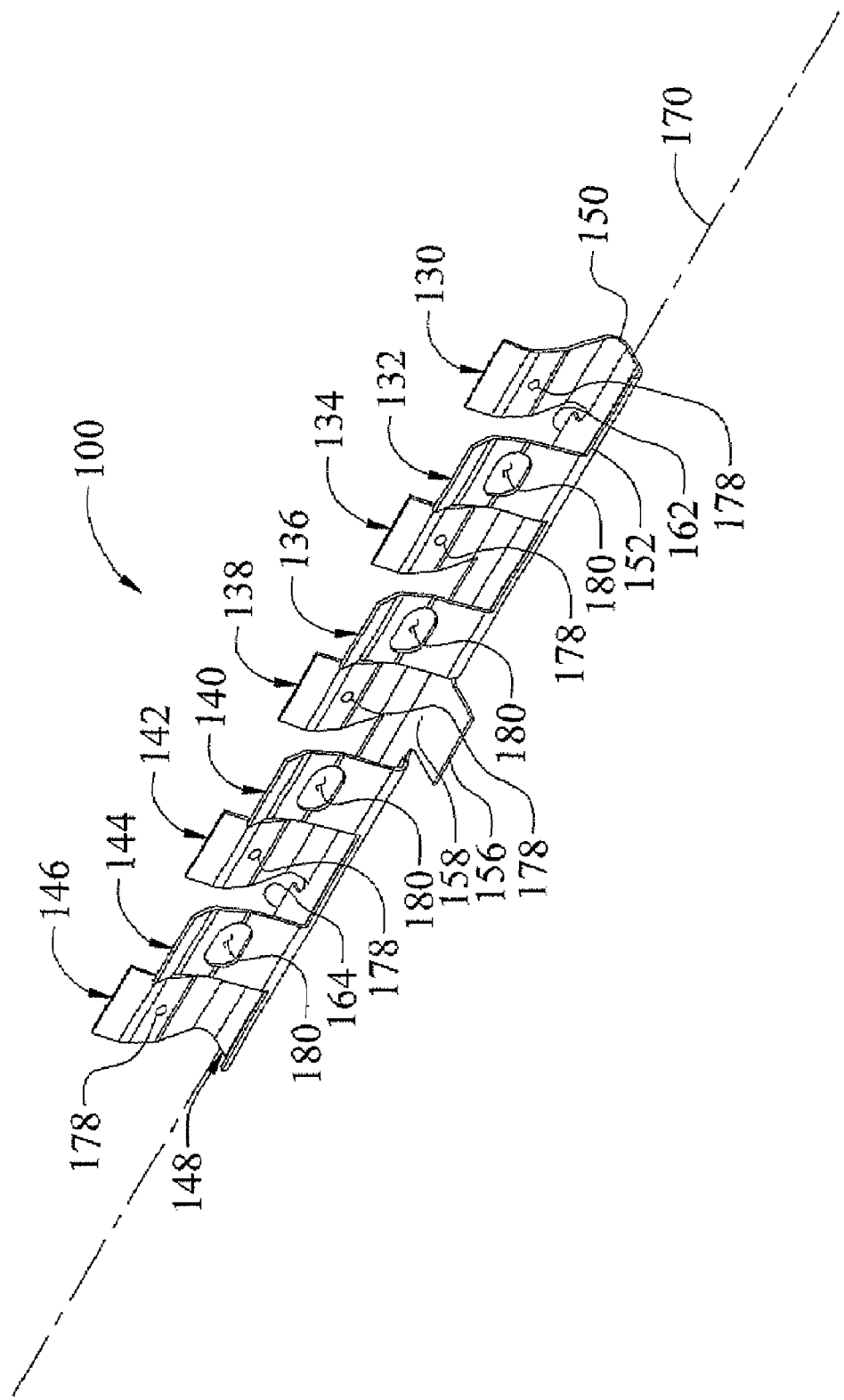
FIG. 2 is a perspective view of one of the mounting clips shown in FIG. 1.
Figure 3:
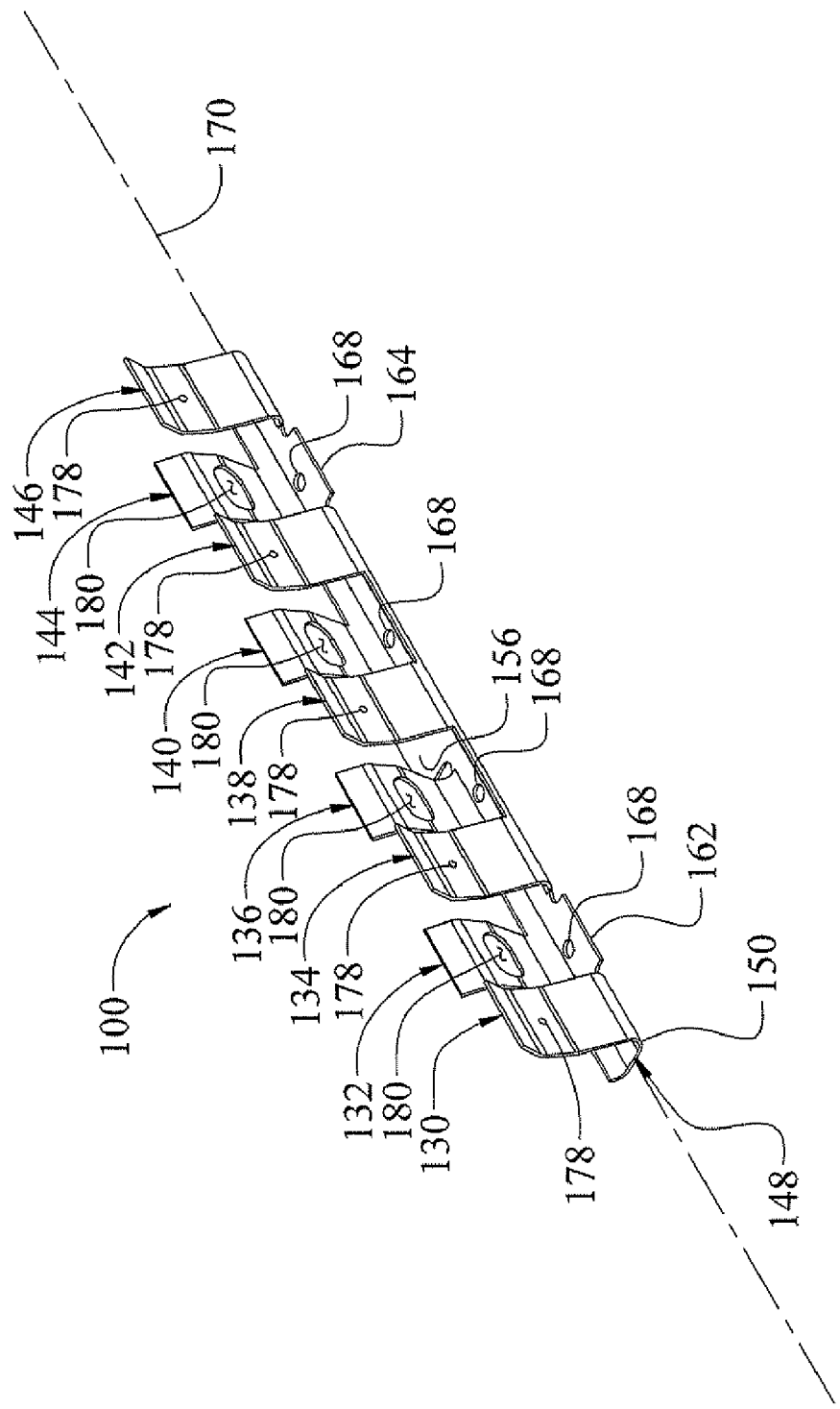
FIG. 3 is a perspective view of the mounting clip shown in FIG. 2 after the mounting clip has been rotated clockwise about ninety degrees.

As shown in FIGS. 2 and 3, the illustrated mounting clip 100 includes nine arms 130 through 146 offset and alternatingly located along a length of a base member 148 of the clip 100. The arms 130 through 146 are monolithically or integrally formed with the base member 148. The arms 130 through 146 extend generally away from the base member 148 in a first, generally upward direction. A first arm 130 is located toward an end portion of the mounting clip 100 and extends away from a first side edge portion 150 of the base member 148. A second arm 132 is offset generally inwardly from the first arm 130 and extends away from a second side edge portion 152 of the base member 148. As can be seen, the first and second arms 130 and 132 are offset along the length of the base member 148 in alternating configuration. A third arm 134 is offset generally inwardly from the second arm 132 and extends away from the base member's first side edge portion 150. The third arm 134 is offset in alternating configuration with the second arm 132. The fourth through ninth arms 136 through 146 are similarly offset and alternatingly oriented along the length of the base member 148, with the ninth arm 146 located generally toward the other end portion of the clip 100 opposite the first arm 130.

The mounting clip 100 includes a generally flat pick-up surface 156 between the fourth and sixth arms 136 and 140 along the base member's second side edge portion 152. The pick-up surface 156 is located generally across from and is generally aligned with the fifth arm 138 of the mounting clip 100. The pick-up surface 156 is configured (e.g., sized, shaped, located, etc.) to enable the mounting clip 100 to be picked up and/or be handled by a head associated with pick-and-place equipment (as will be described in more detail hereinafter). The generally central location of the pick-up surface 156 may preferably help balance the clip 100 during movement by the pick-and-place equipment. In addition, having the pick-up surface aligned with at least one arm of the mounting clip also allows for better EMI shielding performance, as compared to some designs in which a pick-up surface is not aligned with an arm resulting in a gap that can reduce shielding performance.

Figure 4:
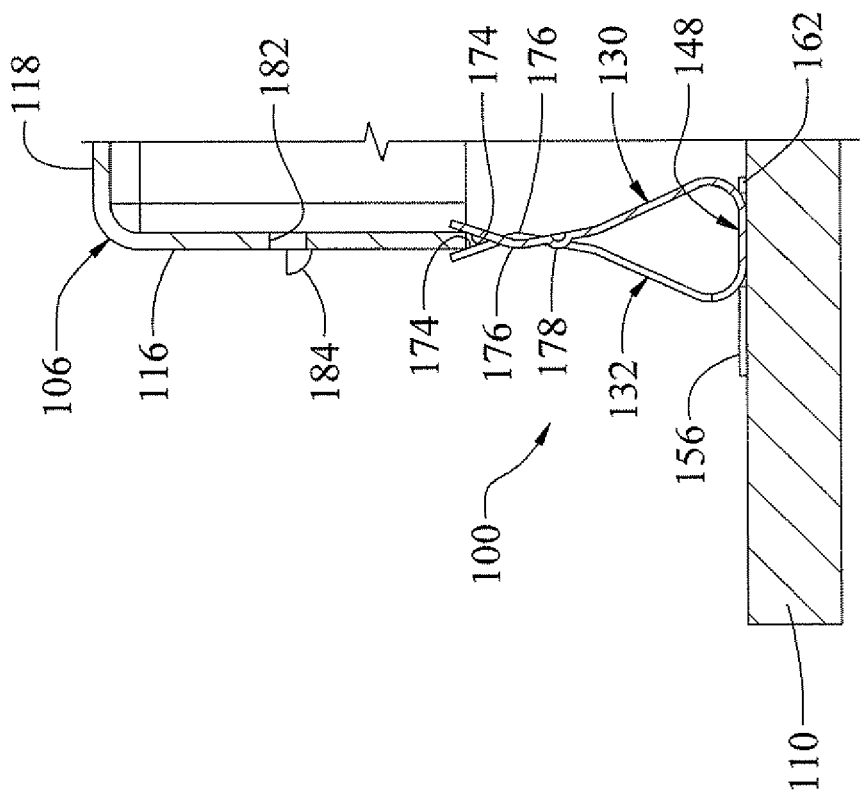
FIG. 4 is an end view of one of the mounting clips shown in FIG. 1 and illustrating the mounting clip mounted to the PCB and a side wall portion of the shielding structure engaging cam surfaces of the mounting clip's arms, where parts of the mounting clip, shielding structure, and PCB broken away.

In the illustrated mounting clip 100, the pick-up surface 156 is monolithically or integrally formed with the base member 148. The pick-up surface 156 is substantially coplanar with an upper surface 158 of the base member 148. The pick-up surface 156 extends outwardly, generally horizontally from the base member 148 in a second direction that is substantially orthogonal to the first direction in which the arms 130 though 146 generally extend. The pick-up surface 156 may extend a lateral distance from the base member 148 greater than or beyond that of the one or more of the arms 130 though 146 (e.g., FIG. 4, etc.). As shown in FIG. 4, the end of the pick-up surface 156 is located outwardly beyond the most distant portion of the arm 132. It is to be understood that the pick-up surface 156 may be configured differently (e.g., shaped, sized, located on the mounting clip 100, etc.) differently than illustrated and described herein within the scope of the invention. For example, another exemplary embodiment includes a mounting clip having a pick-up surface located closer to an end portion of the mounting clip than that shown in FIG. 2. In another exemplary embodiment, a mounting clip includes a pick-up surface located along the other or first side edge portion (instead of, or in addition, to the pick-up surface located along the mounting clip's second side edge portion as shown in FIG. 2). In other exemplary embodiments, mounting clips may include pick-up surfaces separately attached to the clips. For example, in one embodiment a mounting clip includes a pick-up surface comprising a pick-up tab attached to the clip by welding, adhesion, etc. In still other exemplary embodiments, mounting clips may include pick-up surfaces comprising one or more pick-up zones defined, for example, by one or more portions or surfaces of the mounting clips. In yet other exemplary embodiments, mounting clips may each include more than one pick-up surface.

With further reference to FIG. 3, the mounting clip 100 also includes first and second stabilizers 162 and 164 along the base member's first side edge portion 150. The first stabilizer 162 is respectively located generally between the first and third arms 130 and 134. The second stabilizer 164 is located generally between the seventh and ninth arms 142 and 146.

In this illustrated embodiment, the first stabilizer 162 is generally across from and generally aligned with the second arm 132. The second stabilizer 164 is generally across from and generally aligned with the eighth arm 144. The stabilizers 162 and 164 are configured to help stabilize and/or support the mounting clip's positioning on the PCB 110 during and/or following installation.

In the illustrated mounting clip 100, the first and second stabilizers 162 and 164 are monolithically or uniformly formed with the base member 148. The stabilizers 162 and 164 are substantially coplanar with the upper surface 158 of the base member 148. The stabilizers 162 and 164 both extend outwardly, generally horizontally from the base member 148 in a third direction that is substantially orthogonal to the first direction in which extends the arms 130 though 146, and that is substantially parallel to the second direction in which extends the pick-up surface 156.

Alternatively, the stabilizers 162 and 164 may be configured differently (e.g., sized, shaped, located elsewhere, etc.) than what is shown in FIG. 3. For example, one exemplary embodiment includes a mounting clip having a stabilizer located at about an end portion of the mounting clip's base member. In other exemplary embodiments, mounting clips include one or more stabilizers located generally across from different arms than described and illustrated herein. In still other exemplary embodiments, mounting clips may include one or more stabilizers located along second side edge portions of base members. In further exemplary embodiments, mounting clips may include stabilizers located along both first and second side edge portions of base members. In yet other exemplary embodiments, mounting clips may include more or less than two stabilizers, such as four stabilizers, etc.

As described and illustrated, the mounting clip 100 has a monolithic or unitary construction (e.g., single component structure, etc.) such that the arms 130 though 146, pick-up surface 156, and stabilizers 162 and 164 are monolithically or unitarily formed with the base member 148. In other exemplary embodiments, one or more of the arms 130 though 146 and/or one or more of the pick-up surface 156 and/or stabilizers 162 and 164 may comprise a distinct or discrete structure that is separately formed from the base member 148 and then separately attached to the base member 148, for example, by welding, adhesion, etc. to form the mounting clip 100.

The mounting clip 100 may be surface mounted to the PCB 110 for example, by reflow soldering the mounting clip 100 to the PCB 110 before the shielding structure 106 engaged and inserted into the mounting clip 100. By using the mounting clip 100 to attach the shielding structure 106 to the PCB 110, the mounting clip 100 may preferably improve the mounting contact between the shielding structure 106 and the PCB 110. In other words, surface mounting the clip 100 to the PCB 110 and subsequently using the mounting clip 100 to attach the shielding structure 106 to the PCB 110 reduces the importance of the co-planarity of the shielding structure 106 (via the clip 100), as compared to the co-planarity in those applications where a shielding structure is soldered to a PCB without using any mounting clip.

With continued reference to FIG. 3, openings 168 are provided in the base member 148 of the mounting clip 100. These openings 168 are preferably configured for allowing solder to pass therethrough and thereby form a soldered connection that is more resistant to lateral shear between the base member 148 and the PCB 110 when the mounting clip 100 is being surface mounted to the PCB 110. In this particular illustrated embodiments, the mounting clip 100 includes four circular openings 168 longitudinally spaced substantially equally or uniformly along the length of the clip 100 generally along a longitudinal centerline 170 of the base member 148. Alternatively, the openings 168 may be configured differently (e.g., in other shapes and sizes, more or less than four openings, spaced differently and/or located away from the longitudinal centerline 170 of the base member 148, etc.) without departing from the scope of the invention. In addition, one or more of the openings 168 may be formed in the first and/or second side edge portions 150 and/or 152 of the base member 148. In other exemplary embodiments, mounting clips may be secured to PCBs by, for example, mechanical fastens, etc. In still other exemplary embodiments, mounting clips may include base members with non-circular openings and/or with more or less than four openings, including mounting clips having base members without any of such openings.

Figure 5:
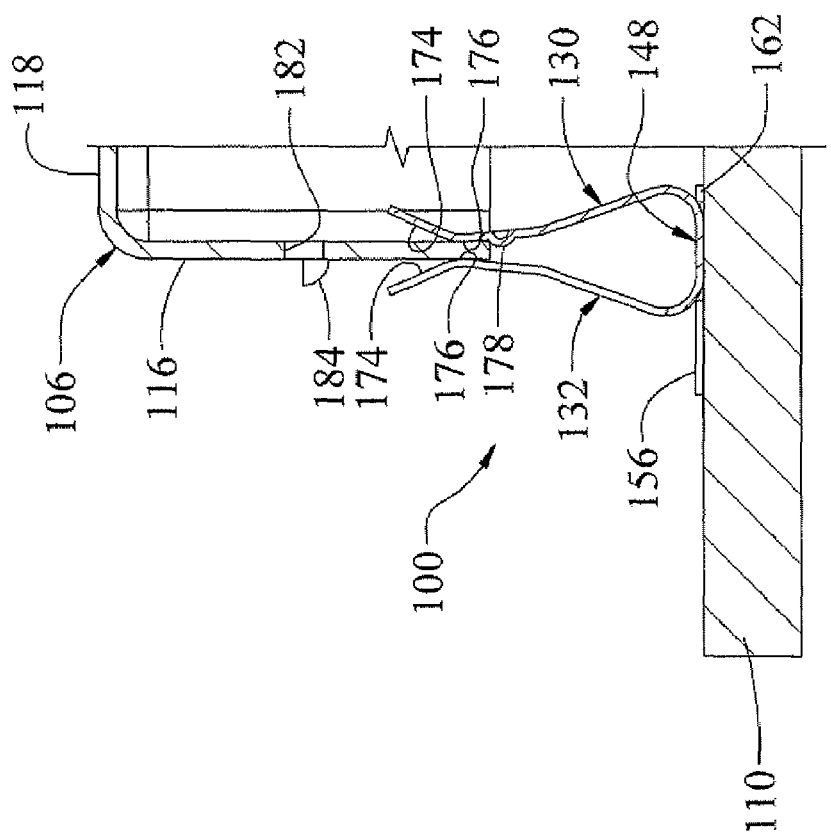
FIG. 5 is another end view of the mounting clip, PCB, and shielding structure shown in FIG. 4 but now illustrating adjacent arms of the mounting clip moved apart and the side wall portion of the shielding structure partly inserted therebetween.

In FIGS. 4 and 5, the mounting clip 100 is shown surface mounted on the PCB 110 with a side wall portion 116 of the shielding structure 106 positioned generally above the clip 100. In this view, only the adjacent first and second arms 130 and 132 are visible. The following discussion is directed toward the first and second adjacent arms 130 and 132 as shown in FIGS. 4 and 5, with it understood that a description of adjacent ones of the other seven arms 134 through 146 of the mounting clip 100 would be substantially similar.

A free end of each of the first and second arms 130 and 132 may be bent generally outward and upward to form an angled upper cam surface 174 and a contact apex 176. The contact apexes 176 are located generally below the cam surfaces 174. In the illustrated mounting clip 100, the contact apexes 176 of the first and second arms 130 and 132 are configured to overlap when the mounting clip 100 is viewed from an end. As shown in FIG. 4, the contact apexes 176 extend across more than half a width of the base member 148 and beyond the longitudinal centerline 170 (FIGS. 2 and 3) of the base member 148. In other exemplary embodiments, mounting clips may include arms with cam surfaces and contact apexes configured differently than illustrated herein. In still other exemplary embodiments, mounting clips may include one or more arms that do not have any of such cam surfaces. For example, one exemplary embodiment includes a mounting clip having arms, the free ends of which do not include any cam surfaces. In yet other exemplary embodiments, mounting clips may be configured with at least two adjacent arms having contact apexes of which only one extends across more than half a width of a base member of the clip. In further exemplary embodiments, mounting clips may be configured with at least two adjacent arms having contact apexes that do not overlap.

With continued reference to FIGS. 4 and 5, the shielding structure 106 may be attached to the PCB 110 by moving the shielding structure's side wall portion 116 relatively downward onto the surface mounted mounting clip 100 towards the base member 148. With this movement, shielding structure's side wall portion 116 is received generally between the cam surfaces 174 of adjacent arms (e.g., the first and second arms 130 and 132 as shown in FIG. 5, etc.) of the mounting clip 100 and above the arm's contact apexes 176. The cam surfaces 174 receive the shielding structure's side wall portion 116 and help guide it into alignment generally over the clip 100. In the illustrated mounting clip 100, the cam surfaces 174 align the side wall portion 116 generally over the centerline 170 (FIGS. 2 and 3) of the base member 148 above the contact apexes 176 (FIG. 4).

With the relative downward movement of the shielding structure's side wall portion 116 towards the mounting clip's base member 148, the shielding structure's side wall portion 116 contacts the arms' cam surfaces 174 and urges the arms generally away from each other and away from the side wall portion 116 (FIG. 5). Adjacent arms (e.g., the first and second arms 130 and 132, etc.) and their overlapping contact apexes 176 move apart (e.g., flex, bend, etc.) relative to each other and allow the side wall portion 116 to be inserted between the contact apexes 176. The adjacent arms (e.g., the first and second arms 130 and 132, etc.) are resilient and inwardly biased, such that the contact apexes 176 engage (e.g., squeeze, grip, etc.) opposite surfaces of the side wall portion 116 between the contact apexes, thereby at least partly helping secure and hold the shielding structure 106 to the mounting clip 100. The squeezing effect due to the resiliency and inward bias of the adjacent arms (e.g., the first and second arms 130 and 132, etc.) also at least partly helps form a releasable but secure attachment of the shielding structure 106 to the mounting clip 100. In the illustrated mounting clip 100, it should be understood that the pick-up surface 156 is not deformed by the shielding structure 106 when the shielding structure's side wall portion 116 is inserted into the clip 100. And when the side wall portion 116 is fully inserted into the mounting clip 100, the side wall portion 116 is adjacent, and in some embodiments may rest on, the base member 148. In other exemplary embodiments, mounting clips may include arms utilizing other than cam surfaces for separating adjacent arms. For example, adjacent arms may be manually separated to allow placement of shielding structure side wall portions between the arms. Alternatively, acceptable automated means may be used to separate the resilient adjacent arms to allow placement of shielding structure side wall portions between the arms. For example, an automated spreader may be used to separate the adjacent arms.

When or if the shielding structure 106 is detached from the PCB 110 by removing the side wall portion 116 thereof from between the arms 130 through 146 of the illustrated mounting clip 100, the resiliency and inward bias of the adjacent arms (e.g., the first and second arms 130 and 132, etc.) will cause the arms to move generally back toward each other so that their contact apexes return to their overlapping configuration as shown in FIG. 4. The arms 130 through 146 may be configured so as to be preferably resistant to yielding such that the arms are capable of being repeatedly moved outward and inward to accommodate multiple and repeated cycles of attachment, detachment, and reattachment of the shielding structure 106 to the mounting clip 100 (and thus PCB 110 to which the mounting clip 100 is surface mounted), while also maintaining the capability of squeezing and/or gripping the shielding structure wall portion 116 between the contact apexes 176 of the arms. In various embodiments, a relatively thin shim may be slid between the side wall portion 116 of the shielding structure 106 and one or more of the mounting clip's arms 130 through 146 to force the arm to move generally away (e.g., bend, flex, deform, etc.) from the side wall portion 116 until the locking structure 184 is moved away from the arm. This process may then need to be repeated until all of the locking structure is released and disengaged.

In various embodiments, the arms 130 through 146 of the mounting clip 100 may further include locking structure 178 and 180 (e.g., FIGS. 1 through 5, etc.) configured to engage corresponding locking structure 182 and 184 (e.g., FIG. 1, etc.) of the shielding structure's side wall portion 116 when the shielding structure 106 is inserted into the clip 100. These locking structures 178, 180, 182, and 184 preferably help releasably secure and hold (or releasably lock) the shielding structure 106 to the mounting clip 100 (along with the squeezing or gripping effect of the illustrated resilient arms 130 through 146) when the shielding structure's side wall portion 116 is positioned between the contact apexes 176 of adjacent arms (e.g., first and second arms 130 and 132, etc.). The locking structures 178, 180, 182, and 184 thus also help releasably attach the shielding structure 106 to the mounting clip 100 (and thus to the PCB 110 to which the mounting clip 100 is surface mounted).

In the illustrated mounting clip 100, each of the first, third, fifth, seventh, and ninth arms 130, 134, 138, 142, and 146 include an outward protrusion 178 (e.g., a catch, snap, latch, tab, detent, protuberance, rib, ridge, ramp-up, dart, lance, dimple, half-dimple, combination thereof, etc.). Each of the second, fourth, sixth, and eighth arms 132, 136, 140, and 144 include an opening 180 (e.g., a recess, void, cavity, slot, groove, hole, depression, combination thereof, etc.). Alternatively, other exemplary embodiments may include mounting clips having arms without any of such locking structure, such that the gripping or squeezing effect between adjacent arms of a mounting clip may operate or function as the sole (or at least primary) means by which the shielding structure is attached and secured to the mounting clip.

FIGS. 6 through 10 illustrate the locking structure 178, 180, 182, and 184 with respect to the fifth, sixth, and seventh arms 138, 140, and 142. The locking structure 178, 180, 182, and 184 with respect to the other arms 130, 132, 134, 136, 144, and 146 may be substantially the same. The arms' locking structure protrusions 178 are each configured to align with and be engagingly received within at least one corresponding locking structure opening 182 of the shielding structure's side wall portion 116. And, the arms' locking structure openings 180 are each configured to align with and engagingly receive at least one corresponding locking structure protrusion 184 of the shielding structure's side wall portion 116. These interlocking connections between protrusions 178 and 184 and respective openings 180 and 182 are preferably releasable so as to effect the selective securing and release of the shielding structure 106 from the mounting clip 100 for selectively attaching and detaching the shielding structure from the PCB 110.

The exemplary shielding structure 106 may thus be attached to the PCB 110 using one or more mounting clips 100. The shielding structure 106 may also be released from the one or more clips 100 and detached from the PCB 100. The shielding structure 106 may subsequently be reinserted into the one or more clips 100 (and secured thereto), and thereby be reattached to the PCB 110. In another exemplary embodiment, each arm of a mounting clip includes at least one opening configured to align with and engagingly receive one or more protrusion formed on a side wall of a shielding structure. In still another exemplary embodiment, each arm of a mounting clip includes at least one protrusion configured to align with and be received by openings in a side wall of a shielding structure. In other exemplary embodiments, mounting clips may include one or more arms without any of such locking structure openings and/or protrusions. Alternative embodiments may include other releasable connections for attaching walls of shielding structures to mounting clips. In still other exemplary embodiments, mounting clips may include arms without any of such locking structure, but instead the gripping or squeezing effect between adjacent arms of a mounting clip may operate or function as the sole (or at least primary) means by which the shielding structure is attached and secured to the mounting clip.

FIG. 11 illustrates a mounting clip 200 according to another exemplary embodiment. Here, the mounting clip 200 includes five arms 230, 232, 234, 236, and 238 extending away from a base member 248 in generally offset alternating configuration.

FIG. 12 illustrates a mounting clip 300 according to still another exemplary embodiment. In this illustrated embodiment, the mounting clip 300 includes three arms 330, 332, and 334 extending away from a base member 348 in generally offset alternating configuration.

FIG. 13 illustrates a mounting clip 400 according to yet another exemplary embodiment. Here, the mounting clip 400 includes two arms 430 and 432 extending way from a base member 448 in generally offset alternating configuration.

In still other exemplary embodiments, mounting clips may include other than two, three, five, or nine arms as illustrated and described herein. For example, mounting clips may include four arms, ten arms, etc.

In some embodiments, a mounting clip (e.g., 100, 200, 300, 400, 500, 700, etc.) may be formed by a stamping process. For example, one or more mounting clips may be stamped from a sheet of metallic material and formed to a desired shape. Acceptable metallic materials may include aluminum, steel, copper, iron, beryllium copper, alloys thereof, etc.

In some embodiments, a mounting clip may comprise arms with locking structure configured to engage a side wall portion of a shielding structure and releasably secure the shielding structure to the clip. In this embodiment, the arms provide little, if any, squeezing or gripping pressure to the side wall portion for helping secure the shielding structure to the clip. Instead, the locking structure may operate or function as the sole (or at least primary) means by which the shielding structure is attached and secured to the mounting clip.

In some embodiments, a mounting clip may include arms having locking structure configured to engage corresponding locking structure on a side wall portion of a shielding structure when the shielding structure is inserted into the mounting clip. The engaged locking structure may be configured to allow disengagement and release by using a shim (or other suitable tool). For example, a shim may be slid between the side wall portion of the shielding structure and one or more of the mounting clip's arms to, for example, force the arm to move generally away (e.g., bend, flex, deform, rotate, etc.) from the side wall portion to thereby release and disengage at least part of the locking structure. This process may then need to be repeated until all of the locking structure is released and disengaged.

With reference now to FIG. 14 and for purposes of illustration only, a description will now be provided of an exemplary process by which one or more mounting clips 500 may be attached to a PCB using pick-and-place equipment (e.g., pneumatic heads, vacuum pick-and-place heads, suction cup pick-and-place heads, etc.). The illustrated mounting clip 500 may include one or more features of the exemplary mounting clips (e.g., 100, 200, 300, 400, 700, etc.) described and/or illustrated herein. FIG. 14 illustrates an exemplary manner in which the mounting clips 500 may be stored in a continuous tape reel 588 for retrieval by a head (not illustrated) of pick-and-place equipment. The mounting clips 500 may be inserted and stored in the tape reel 588 following manufacture of the clips before the clips are distributed or shipped to customers.

As shown in FIG. 14, mounting clips 500 are stored in pockets 590 formed within a plastic carrier tape 592, which, in turn, may be wound onto and unwound from the tape reel 588. A cover strip 594 may be adhesively or heat-seal applied to the top layer of the carrier tape 592 to hold the mounting clips 500 in position within the pockets 590. The carrier tape 592 may be wound onto or wrapped around the reel 588 before shipment to a customer. Upon receipt, the customer may install the reel 588 (with the mounting clips 500 positioned in the pockets 590 thereof) to a feeder associated with an automatic pick-and-place machine.

The carrier tape 592 may have holes 596 formed along one or both side edges thereof for driving through a feeder mechanism (not illustrated) installed in a pick-and-place machine. The tape 592 (with the mounting clips 500 stored within the pockets 590 and the cover strip 594 in place) may be unwound from the supply reel 588 in the feeder. The feeder may peel back the top cover strip 594. The head (not illustrated) of the pick-and-place machine may apply suction to a pick-up surface 556 of one of the mounting clips 500 to lift that clip from its corresponding pocket 590 of the tape 592. The pick-up surface 556 of the mounting clip 500 is accessible through the pocket's opening to a head of the pick-and-place machine. After retrieving the mounting clip 500 from the pocket 590, the head may then position the mounting clip 500 on a surface of a PCB. By providing mounting clips capable of being retrieved from pockets by pick-and-place machines associated with assembly line production, embodiments disclosed herein may allow for increased productivity for assembly line production of PCBs, etc.

FIG. 15 illustrates a flat piece of material or blank 697 that may be formed into a mounting clip according to exemplary embodiments. As shown by this exemplary embodiment, the alternating configuration of the mounting clip arms allows for nesting or interlacing of the blank 697, which, in turn, allows for reductions in the amount of raw material needed to make the mounting clip. After stamping the flat pattern (FIG. 15) in the piece of material 697, the blank may be folded, bent, or otherwise formed into the configuration of a mounting clip. As shown by the arrows 698 and 699, the width of the flat part is greater than the width of the flank blank. Even though a mounting clip may be formed integrally in this example, such is not required for all embodiments. For example, other embodiments may include one or more discrete components that are separately attached to the mounting clip, for example, by welding, adhesives, among other suitable methods. Alternative configurations (e.g., shapes, sizes, etc.), materials, and manufacturing methods may be used for making a grounding clip.

FIG. 16 illustrates a mounting clip 700 according to another exemplary embodiment. FIG. 16 also illustrates an exemplary solder pad layout 707 (also shown in FIG. 21) that may be used when surface mounting the clip to a printed circuit board or other substrate.

With continued reference to FIG. 16, the mounting clip 700 includes five arms 730, 732, 734, 736, and 740 extending way from a base member 748 in generally offset alternating configuration. The mounting clip 700 also includes a generally flat pick-up surface 756.

FIG. 22 illustrates a flat piece of material or blank 897 that may be formed into the mounting clip 700 shown in FIGS. 16 through 20 according to exemplary embodiments. After stamping the flat pattern (FIG. 22) in the piece of material 897, the blank may be folded, bent, or otherwise formed into the configuration of the mounting clip 700 shown in FIGS. 16 through 20. Even though the mounting clip 700 may be formed integrally in this example, such is not required for all embodiments. For example, other embodiments may include one or more discrete components that are separately attached to the mounting clip, for example, by welding, adhesives, among other suitable methods. Alternative configurations (e.g., shapes, sizes, etc.), materials, and manufacturing methods may be used for making a grounding clip.

In view of at least the foregoing, it should now be appreciated that the mounting clips (e.g., 100, 200, 300, 400, 500, 700, etc.) disclosed and illustrated herein may allow clips to be mounted to PCBs (e.g., by soldering, etc.) before attaching shielding structures to the clip. This may make mounting the clips (e.g., 100, 200, 300, 400, 500, 700, etc.) to PCBs more convenient since the mounting may take place without interference from the shielding structure(s), which will be attached after the clips have been mounted to the PCB. In addition, the releasable attachment provided by the mounting clips (e.g., 100, 200, 300, 400, 500, 700, etc.) allows repeated access to electronic components of PCBs for repair, maintenance, replacement, etc. Furthermore, and as previously stated, the mounting clips (e.g., 100, 200, 300, 400, 500, 700, etc.) allow for releasing shielding structures from arms of the clips and removing the shielding structures from the PCBs, and subsequently reattaching the shielding structures to the PCBs using the same mounting clips already mounted on the PCBs.

Certain terminology is used herein for purposes of reference only, and thus is not intended to be limiting. For example, terms such as "upper", "lower", "above", "below", "top", "bottom", "upward", and "downward" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A clip compatible with surface mount technology and surface mountable to a substrate for allowing repeated releasable attachment and detachment of a shielding structure thereto, the clip comprising:
   a base member having generally opposed first and second side edge portions;
   two or more arms extending generally upwardly in a first direction from the base member, the two or more arms including first and second arms extending generally upwardly from the respective first and second side edge portions of the base member such that the first and second arms are offset in an alternating arrangement along a length of the base member, the first and second arms having overlapping contact apexes for squeezing opposite surfaces of a wall portion of the shielding structure when the shielding structure's wall portion is positioned therebetween;
   first and second stabilizers extending generally horizontally outwardly from the second edge portion of the base member at locations generally opposing corresponding ones of the two or more arms, the first and second stabilizers configured to help stabilize the clips positioning on the substrate during installation;
   a generally flat pick-up surface extending generally horizontally from the base member in a second direction substantially orthogonal to the first direction, the pick-up surface extending outwardly beyond the first edge portion of the base member, the pick-up surface longitudinally disposed generally between the first and second stabilizers, the pick-up surface configured to enable the clip to be picked up by a head associated with pick-and-place equipment; and
   locking structure on at least one of the two or more arms configured to engage the shielding structure for helping releasably secure the shielding structure to the clip when the shielding structure's wall portion is positioned between the contact apexes of the first and second arms.

2. The clip of claim 1, wherein the pick-up surface is substantially coplanar with an upper surface of the base member.

3. The clip of claim 1, wherein the clip has a monolithic construction.

4. The clip of claim 1, wherein the contact apex of at least one of the first and second arms is configured so as to extend across a longitudinal centerline axis of the base member.

5. The clip of claim 1, wherein at least one of the first and second arms include at least one camming surface portion configured to contact the shielding structure's wall portion during installation, the contact causing relative movement of the first and second arms generally away from each other to thereby facilitate positioning of the shielding structure's wall portion generally between the first and second arms.

6. The clip of claim 1, wherein the locking structure includes at least one protrusion configured to be engagingly received within a corresponding opening within the shielding structure's wall portion when the shielding structure's wall portion is positioned between the contact apexes of the first and second arms.

7. The clip of claim 1, wherein the locking structure includes at least one opening configured to engagingly receive at least one protrusion of the shielding structure's wall portion when the shielding structure's wall portion is positioned between the contact apexes of the first and second arms.

8. The clip of claim 1, wherein the two or more arms further comprise a third arm extending upwardly from the first side edge portion of the base member, the third arm being offset from the first and second arms along the length of the base member.

9. The clip of claim 1, wherein the two or more arms comprise multiple arms alternatingly extending from the generally opposing first and second side edge portions of the base member in an offset alternating configuration.

10. The clip of claim 1, wherein the base member includes one or more openings for allowing solder to form a connection between the base member and the substrate.

11. The clip of claim 1 in combination with a carrier tape for transporting the clip, the carrier tape having at least one pocket with an opening into the pocket and in which is positioned the clip of claim 1 such that the pick-up area is adjacent the opening into the pocket and accessible to a head associated with pick-and-place equipment for retrieval of the clip from the pocket.

12. The clip of claim 1, wherein the vertical force needed to insert the shielding structure's wall portion generally between the arms of the clip is less than the vertical force required to remove the shielding structure's wall portion from the clip.

13. The clip of claim 1, wherein the pick-up surface extends from the base member at a location generally opposing at least one of the arms.

14. An electrical device comprising a printed circuit board, a shielding structure having a wall portion, and the clip of claim 1, wherein the clip is surface mounted to the printed circuit board, and wherein the wall portion of the shielding structure is positioned between the contact apexes of the first and second arms of the clip, with the clip's locking structure engaged with the shielding structure thereby helping releasably secure the shielding structure to the clip when the shielding structure's wall portion is positioned.

15. A clip compatible with surface mount technology and surface mountable to a substrate for allowing repeated releasable attachment and detachment of a shielding structure thereto, the clip comprising:
   a base member having generally opposed first and second side edge portions;
   two or more arms extending generally upwardly in a first direction from the base member, the two or more arms including first and second arms extending generally upwardly from the respective first and second side edge portions of the base member such that the first and second arms are offset in an alternating arrangement along a length of the base member, the first and second arms having overlapping contact apexes for squeezing opposite surfaces of a wall portion of the shielding structure when the shielding structure's wall portion is positioned therebetween;
   a substantially flat pick-up surface extending generally horizontally from the base member in a second direction substantially orthogonal to the first direction, the pick-up surface configured to enable the clip to be picked up by a head associated with pick-and-place equipment; and
   at least one stabilizer extending generally horizontally from the base member in the second direction at a location generally opposing at least one of the arms, the at least one stabilizer configured to help stabilize the clip's positioning on the substrate during installation;
   wherein the pick-up surface extends outwardly beyond the first edge portion of the base member;

wherein the at least one stabilizer comprises first and second stabilizers extending generally horizontally outwardly from the second edge portion of the base member; and wherein the pick-up surface is longitudinally disposed generally between the first and second stabilizers.

16. The clip of claim 15, wherein the at least one stabilizer is substantially coplanar with the base member.

17. An electrical device comprising a printed circuit board, a shielding structure having a wall portion, and the clip of claim 15, wherein the clip is surface mounted to the printed circuit board, and wherein the wall portion of the shielding structure is positioned between the contact apexes of the first and second arms of the clip.

18. A clip compatible with surface mount technology and surface mountable to a substrate for allowing repeated releasable attachment and detachment of a shielding structure thereto, the clip comprising:

a base member having generally opposed first and second side edge portions;

two or more arms extending generally upwardly in a first direction from the base member, the two or more arms including first and second arms extending generally upwardly from the respective first and second side edge portions of the base member such that the first and second arms are offset in an alternating arrangement along a length of the base member, the first and second arms having overlapping contact apexes for squeezing opposite surfaces of a wall portion of the shielding structure when the shielding structure's wall portion is positioned therebetween; and first and second stabilizers extending generally horizontally outwardly from the second edge portion of the base member at locations generally opposing corresponding ones of the two or more arms, the first and second stabilizers configured to help stabilize the clip's positioning on the substrate during installation;

a substantially flat pick-up surface configured to enable the clip to be picked up by a head associated with pick-and-place equipment, the pick-up surface extending generally horizontally from the base member in a second direction substantially orthogonal to the first direction and at a location substantially aligned with at least one of the arms, the pick-up surface extending outwardly beyond the first edge portion of the base member, the pick-up surface longitudinally disposed generally between the first and second stabilizers.

19. The clip of claim 18, wherein the pick-up surface is substantially coplanar with an upper surface of the base member.

20. The clip of claim 19, further comprising a third arm extending generally upwardly from the first side edge portion of the base member, the third arm being offset from the first and second arms along the length of the base member, and wherein the pick-up surface is longitudinally disposed generally between the first and third arms.

21. The clip of claim 18, wherein the pick-up surface extends a lateral distance beyond the base member greater than that of the arms.

22. The clip of claim 18, wherein the pick-up surface is free of deformation when the shielding structure's wall portion is positioned between the contact apexes of the first and second arms.

23. An electrical device comprising a printed circuit board, a shielding structure having a wall portion, and the clip of claim 18, wherein the clip is surface mounted to the printed circuit board, and wherein the wall portion of the shielding structure is positioned between the contact apexes of the first and second arms of the clip.

* * * * *